(12) United States Patent
Kobayashi et al.

(10) Patent No.: US 7,605,455 B2
(45) Date of Patent: Oct. 20, 2009

(54) SEMICONDUCTOR DEVICE

(75) Inventors: Hiroya Kobayashi, Hamamatsu (JP);
Masaharu Muramatsu, Hamamatsu (JP)

(73) Assignee: Hamamatsu Photonics K.K.,
Hamamatsu-shi, Shizuoka (JP)

( * ) Notice: Subject to any disclaimer, the term of this patent is extended or adjusted under 35 U.S.C. 154(b) by 195 days.

(21) Appl. No.: 10/573,469

(22) PCT Filed: Sep. 24, 2004

(86) PCT No.: PCT/JP2004/013964

§ 371 (c)(1),
(2), (4) Date: Jan. 19, 2007

(87) PCT Pub. No.: WO2005/031871

PCT Pub. Date: Apr. 7, 2005

(65) Prior Publication Data

US 2007/0205480 A1    Sep. 6, 2007

(30) Foreign Application Priority Data

Sep. 25, 2003   (JP)   ............................. 2003-333871

(51) Int. Cl.
*H01L 23/02* (2006.01)
(52) U.S. Cl. ................... 257/680; 257/681; 257/447; 438/116
(58) Field of Classification Search ............... 257/680, 257/460, 447, 466, E25.032, E33.056, E33.059

See application file for complete search history.

(56) References Cited

U.S. PATENT DOCUMENTS

| | | |
|---|---|---|
| 5,818,113 A | 10/1998 | Iseki et al. |
| 5,918,113 A | 6/1999 | Higashi et al. |
| 6,201,305 B1 | 3/2001 | Darveaux et al. |
| 6,204,163 B1 | 3/2001 | Panchou et al. |
| 6,410,415 B1 | 6/2002 | Estes et al. |
| 6,571,466 B1 * | 6/2003 | Glenn et al. .................. 29/841 |
| 6,605,828 B1 | 8/2003 | Schwarzrock et al. |
| 6,828,657 B2 | 12/2004 | Hara et al. |
| 7,060,602 B2 | 6/2006 | Saito |

(Continued)

FOREIGN PATENT DOCUMENTS

DE        19848834        7/1999

(Continued)

*Primary Examiner*—Theresa T Doan
(74) *Attorney, Agent, or Firm*—Drinker Biddle & Reath LLP

(57) ABSTRACT

With this semiconductor device, the distortion and cracking of a thinned portion of a semiconductor substrate are prevented to enable high precision focusing with respect to a photodetecting unit and uniformity and stability of high sensitivity of the photodetecting unit to be maintained. A semiconductor device 1 has a semiconductor substrate 10, a wiring substrate 20, conductive bumps 30, and a resin 32. A CCD 12 and a thinned portion 14 are formed on semiconductor substrate 10. Electrodes 16 of semiconductor substrate 10 are connected via conductive bumps 30 to electrodes 22 of wiring substrate 20. Wiring substrate 20 has formed therein a groove portion 26a that surrounds a region opposing thinned portion 14 and groove portions 26b that extend to an exposed surface of wiring substrate 20 from groove portion 26a. Insulating resin 32 fills a gap between outer edge 15 of thinned portion 14 and wiring substrate 20 to reinforce the bonding strengths of conductive bumps 30.

6 Claims, 8 Drawing Sheets

U.S. PATENT DOCUMENTS

| | | | |
|---|---|---|---|
| 7,274,101 B2 * | 9/2007 | Tomita et al. | 257/730 |
| 2002/0008315 A1 | 1/2002 | Park | |
| 2002/0020859 A1 | 2/2002 | Muramatsu | |
| 2002/0084532 A1 | 7/2002 | Neogi et al. | |
| 2002/0115278 A1 | 8/2002 | Kawai | |
| 2007/0272997 A1 | 11/2007 | Kobayashi et al. | |
| 2007/0272998 A1 * | 11/2007 | Kobayashi et al. | 257/460 |

FOREIGN PATENT DOCUMENTS

| | | |
|---|---|---|
| EP | 0 544 294 | 6/1993 |
| EP | 0 821 408 | 1/1998 |
| EP | 1 154 457 | 11/2001 |
| EP | 1 223 612 | 7/2002 |
| JP | 6-29506 | 2/1994 |
| JP | 6-196680 | 7/1994 |
| JP | 11-026922 | 1/1999 |
| JP | 2000-228573 | 8/2000 |
| JP | 2002-9265 | 1/2002 |
| JP | 2003-078120 | 3/2003 |
| JP | 2003-124259 | 4/2003 |
| JP | 2003-168792 | 6/2003 |
| JP | 2004-214344 | 7/2004 |
| WO | WO 03/028414 A1 | 4/2003 |

* cited by examiner

SEMICONDUCTOR DEVICE

TECHNICAL FIELD

This invention concerns a semiconductor device and particularly concerns a back-illuminated semiconductor device.

BACKGROUND ART

A so-called back-illuminated semiconductor photodetecting device has been known conventionally as a semiconductor device. This type of semiconductor device has a semiconductor substrate and has a photodetecting unit on one surface of the semiconductor substrate. A portion of the semiconductor substrate on the side opposite the photodetecting unit is trimmed to form a recessed portion in the semiconductor substrate. A thinned portion is thus provided at the portion of the semiconductor substrate at which the photodetecting unit is disposed. This thinned portion is provided to accommodate ultraviolet rays, soft X-rays, electronic beams, and other energy rays that will be absorbed and cannot be detected at high sensitivity by a thick semiconductor substrate. At this thinned portion, light that is made incident on the surface at the recessed portion side of the semiconductor substrate is detected by the photodetecting unit.

As an example of a back-illuminated semiconductor device, there is a semiconductor device that has a BT-CCD (back-thinned CCD). The BT-CCD is used as a detecting unit of a semiconductor inspecting device. An example of a conventional semiconductor device having a BT-CCD is described in Patent Document 1.

FIG. 8 is a sectional view of an arrangement of the semiconductor device described in Patent Document 1. As shown in FIG. 8, a P-type silicon layer 104, which is a semiconductor substrate having a CCD 103 on a surface that opposes a wiring substrate 102, is mounted via metal bumps 105 onto wiring substrate 102, which is fixed to a bottom portion of the interior of a package 101. Each wiring 106 on wiring substrate 102 is connected at one end to a metal bump 105 and has a bonding pad (not shown) for externally taking out detected signals at the other end, and each bonding pad is electrically connected by a bonding wire 107 to a lead terminal (not shown) of package 101. Furthermore, a gap between wiring substrate 102 and P-type silicon layer 104 is filled with an underfill resin 108 for reinforcing the bonding strengths of metal bumps 105.

Patent Document 1: Japanese Published Unexamined Patent Application No. Hei 6-196680

However, when the underfill resin fills the gap between the wiring substrate and the thinned portion of the semiconductor substrate as shown in FIG. 8, the thinned portion may crack due to the stress that arises due to a thermal expansion coefficient difference between the underfill resin and the semiconductor substrate in the process of heating or cooling to cure the underfill resin. Even if cracking does not occur, the thinned portion may become distorted by being pulled by the contraction of the underfill resin. Such distortion of the thinned portion of the semiconductor substrate may bring about adverse effects on focusing with respect to the photodetecting unit and uniformity and stability of sensitivity of the photodetecting unit during use of the semiconductor device.

This invention was made in view of the above issue and an object thereof is to provide a semiconductor device, with which the distortion and cracking of a thinned portion of a semiconductor substrate are prevented to enable high precision focusing with respect to a photodetecting unit and uniformity and stability of high sensitivity of the photodetecting unit to be maintained.

DISCLOSURE OF THE INVENTION

In order to solve the above issue, this invention provides a semiconductor device, comprising: a semiconductor substrate, having a photodetecting unit formed on one surface, a thinned portion formed by etching a region, opposing the photodetecting unit, of another surface, and first electrodes disposed on the one surface at an outer edge of the thinned portion and electrically connected to the photodetecting unit; a wiring substrate, disposed to oppose the one surface side of the semiconductor substrate and having second electrodes connected via conductive bumps to the first electrodes; and a resin, filling a gap between the wiring substrate and the outer edge of the thinned portion to reinforce the strengths of bonding of the respective first electrodes and the respective second electrodes with the conductive bumps; and being characterized in that the wiring substrate has formed therein a groove portion that surrounds a region opposing the thinned portion and communicating portions that extend from the groove portion to an exposed surface of the wiring substrate.

With this semiconductor device, the resin fills the gap between the wiring substrate and the outer edge of the thinned portion. The strength of bonding of the conductive bumps with the first electrodes that are disposed at the outer edge of the thinned portion and the strength of bonding of the conductive bumps with the second electrodes of the wiring substrate are thus reinforced. Meanwhile, because the resin does not fill a gap between the wiring substrate and the thinned portion of the semiconductor substrate, even when stress due to the thermal expansion coefficient difference between the resin and the semiconductor substrate arises during heating or cooling in the process of curing the resin, etc., the influence of the stress on the thinned portion will be small and distortion and cracking of the thinned portion will be prevented. Thus with this semiconductor device, high precision focusing is enabled with respect to the photodetecting unit and uniformity and stability of high sensitivity of the photodetecting unit can be exhibited during use.

Furthermore, the wiring substrate has a groove portion formed therein so as to surround the region opposing the thinned portion. Thus, for example, in the process of filling the gap between the semiconductor substrate and the wiring substrate with the resin using the capillary phenomenon during manufacture of the semiconductor device, when the resin entering into the gap from a periphery of the semiconductor substrate reaches the groove portion, the capillary phenomenon does not proceed any further and the entry of the resin stops. By such a groove portion being provided in the wiring substrate, an arrangement, wherein the resin fills the gap at which the conductive bumps exist, that is, the gap between the wiring substrate and the outer edge of the thinned portion while the gap between the wiring substrate and the thinned portion at the inner side of the groove portion is left unfilled, can be readily realized.

With this semiconductor device, the gap between the thinned portion and the wiring substrate may become completely surrounded by the resin that fills the gap between the outer edge of the thinned portion and the wiring substrate. In this case, if the surrounded gap becomes sealed, the thinned portion may become distorted due to expansion or contraction of the air inside the sealed space during heating or cooling in the process of curing the resin, etc. In regard to this issue, with the present semiconductor device, the communicating portions that extend from the groove portion to the exposed surface of the wiring substrate are provided so that air can move freely between the gap surrounded by the resin and the exterior of the semiconductor device via the communicating portions, and the gap surrounded by the resin is thereby prevented from becoming sealed.

An "exposed surface of the wiring substrate" refers to a region of the upper surface (surface opposing the semiconductor substrate) of the wiring substrate that is located at the outer side of the region covered by the above-mentioned resin as well as to a bottom surface and a side surface of the wiring substrate.

The communicating portions are preferably second groove portions that are formed in the surface of the wiring substrate that opposes the semiconductor substrate. In this case, since the groove portion and the communicating portions (second groove portions) can be formed in the same process, the manufacture of the wiring substrate and thus the semiconductor as a whole is facilitated.

The communicating portions are preferably through-holes that pass through the wiring substrate. In this case, even if the entire gap between the outer edge of the thinned portion of the semiconductor substrate and the wiring substrate is filled with the resin, the sealing of the gap between the thinned portion and the wiring substrate can be prevented by the through-holes and thus the mechanical strength of the semiconductor substrate can be improved further.

The photodetecting unit may have a plurality of pixels that are arrayed one-dimensionally or two-dimensionally. This invention's semiconductor device is especially useful in this case because uniformity and stability of high sensitivity is required among the plurality of pixels.

Also preferably, the wiring substrate has first lead terminals, to which signals that drive the photodetecting unit are provided, and second lead terminals that output detected signals from the photodetecting unit, and among the plurality of second electrodes, those that are connected to the second lead terminals are positioned inside the region surrounded by the groove portion, and among the plurality of second electrodes, those that are connected to the first lead terminals are positioned outside the region surrounded by the groove portion. In this case, since the electrodes that provide the driving signals and the electrodes for reading signals are positioned in a physically separated manner across the groove portion as a boundary, crosstalk can be restrained.

A gas (air) is interposed between the thinned portion of the semiconductor substrate and the wiring substrate. As this gas, an inert gas, such as nitrogen or argon is preferable, and distortions of both substrates can thereby be tolerated and degradation of the inner surfaces of the substrates can be restrained.

By this invention, a semiconductor device can be realized with which the distortion and cracking of a thinned portion of a semiconductor substrate are prevented to enable high precision focusing with respect to a photodetecting unit and uniformity and stability of high sensitivity of the photodetecting unit to be maintained.

Explanation of Reference Numerals

Figure 1:
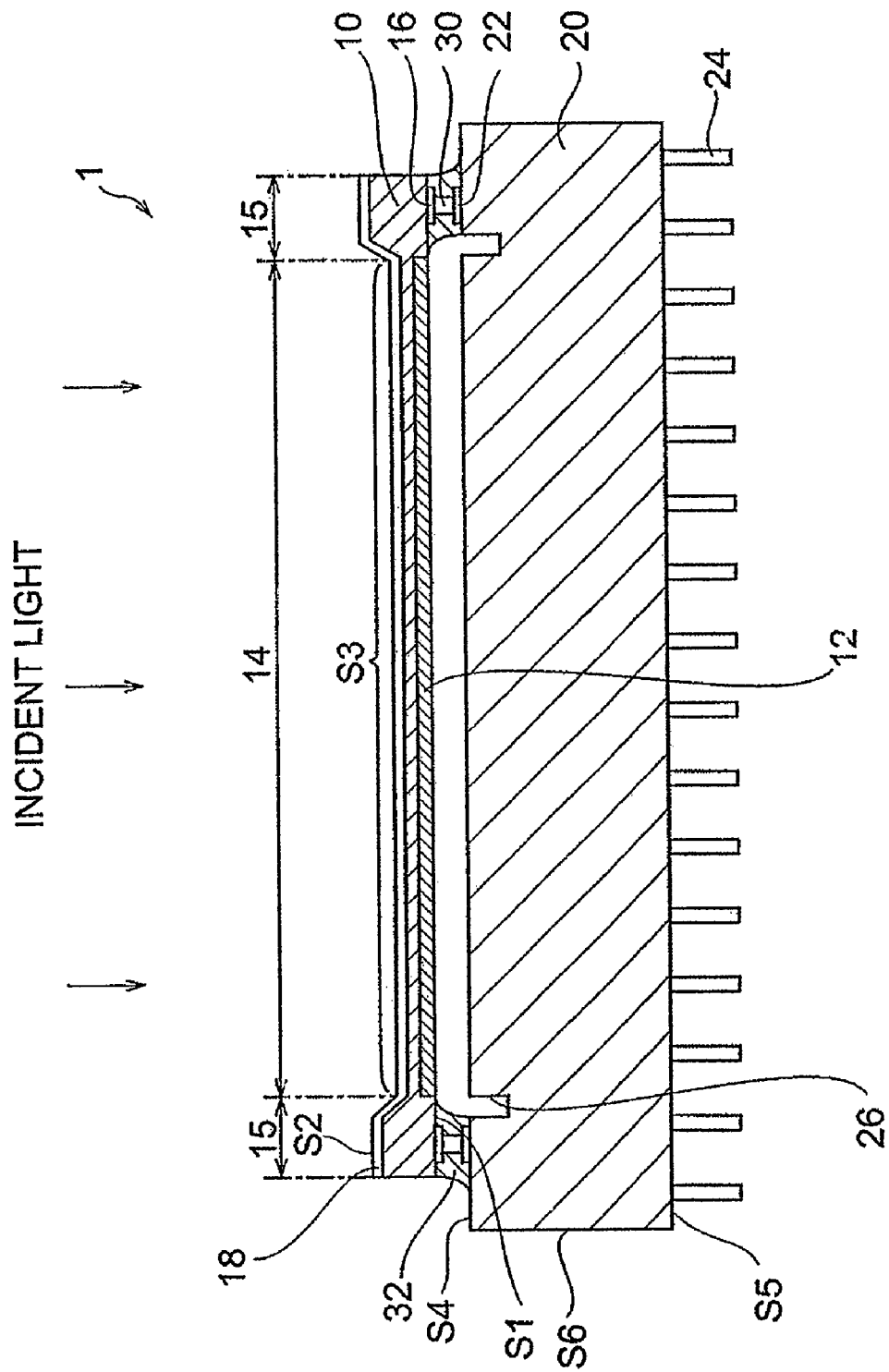
FIG. 1 is a sectional view of an embodiment of this invention's semiconductor device.

| | |
|---|---|
| 1, 2 | semiconductor device |
| 10 | semiconductor substrate |
| 14 | thinned portion |
| 15 | outer edge |
| 16 | electrode |
| 18 | accumulation layer |
| 20, 21 | wiring substrate |
| 22 | electrode |
| 24 | lead terminal |
| 26a, 27a | groove portion |
| 26b | groove portion (communicating portion) |
| 27b | through-hole (communicating portion) |
| 28 | chip resistor |
| 30 | conductive bump |
| 32 | resin |

BEST MODES FOR CARRYING OUT THE INVENTION

Preferred embodiments of this invention's semiconductor device shall now be described in detail along with the drawings. In the description of the drawings, the same elements shall be provided with the same symbols and overlapping description shall be omitted. The dimensional proportions in the drawings do not necessary match those of the description.

FIG. 1 is a sectional view of an embodiment of this invention's semiconductor device. A semiconductor device 1 has a semiconductor substrate 10, a wiring substrate 20, conductive bumps 30, and a resin 32. Semiconductor substrate 10 is a BT-CCD (back-thinned CCD) and has a CCD 12 formed as a photodetecting unit on a portion of a top layer of its front surface S1 side. Semiconductor substrate 10 includes, for example, a silicon $P^+$ layer, a P-type epitaxial layer formed above the silicon $P^+$ layer, and an unillustrated set of transfer electrodes formed on the epitaxial layer. CCD 12 has a plurality of pixels that are arrayed two-dimensionally. Also, a thinned portion 14 is formed by thinning by etching a region, opposing CCD 12, of a back surface S2. The etched portion has a truncated rectangular pyramidal profile. A surface of thinned portion 14 at the etched side is a flat and rectangular, light-incident surface S3, and this light-incident surface S3 is formed to be substantially the same in size as CCD 12. Semiconductor substrate 10 as a whole has a rectangular shape in plan view. Semiconductor substrate 10 is, for example, approximately 15 to 40 μm thick at thinned portion 14 and approximately 300 to 600 μm thick at an outer edge 15 of thinned portion 14. Outer edge 15 of thinned portion 14 refers to a portion of semiconductor substrate at the periphery of thinned portion 14 and is thicker than thinned portion 14.

Electrodes 16 (first electrodes) are formed on front surface S1 of outer edge 15. These electrodes 16 are electrically connected to the set of transfer electrodes of CCD 12 by wirings that are omitted from illustration. The entirety of back surface S2 of semiconductor substrate 10, including light-incident surface S3, is covered by an accumulation layer 18. Accumulation layer 18 is of the same conductive type as semiconductor substrate 10, however, is higher in impurity concentration than semiconductor substrate 10.

Semiconductor substrate 10 is mounted onto wiring substrate 20 by flip-chip bonding. Wiring substrate 20 is thus positioned to oppose the front surface S1 side of semiconductor substrate 10. Electrodes 22 (second electrodes) are formed at positions of wiring substrate 20 that oppose electrodes 16 of semiconductor substrate 10, and these electrodes 22 are connected via conductive bumps 30 to electrodes 16. Lead terminals 24, electrodes 22, conductive bumps 30, and electrodes 16 are thus connected to the CCD transfer electrodes and CCD driving signals are input into lead terminals 24. An output of an amplifier that outputs a CCD read signal is taken out from a lead terminal 24 via an electrode 16, a conductive bump 30, and an electrode 22. Wiring substrate 20 is formed, for example, of a multilayer ceramic substrate. An upper surface S4 (surface opposing semiconductor substrate 10) of wiring substrate 20 has a wider area than semiconductor substrate 10 and a region that does not oppose semiconductor substrate 10 exists at an edge of upper surface S4.

Due to the interposition of conductive bumps 30, a gap exists between semiconductor substrate 10 and wiring substrate 20. Of this gap, a portion that is sandwiched by outer edge 15 and wiring substrate 20 is filled with insulating resin 32 (underfill resin) for reinforcing the bonding strengths of conductive bumps 30 (specifically the strengths of bonding of conductive bumps 30 with the respective electrodes 16 and electrodes 22). As resin 32, for example, an epoxy-based resin, a urethane-based resin, a silicone-based resin, an acrylic-based resin, or a composite of such resins is used.

Lead terminals 24 are disposed at a bottom surface S5 (surface at the opposite side of upper surface S4) of wiring substrate 20. Lead terminals 24 are connected to internal wirings (not shown) of wiring substrate 20.

Figure 2:
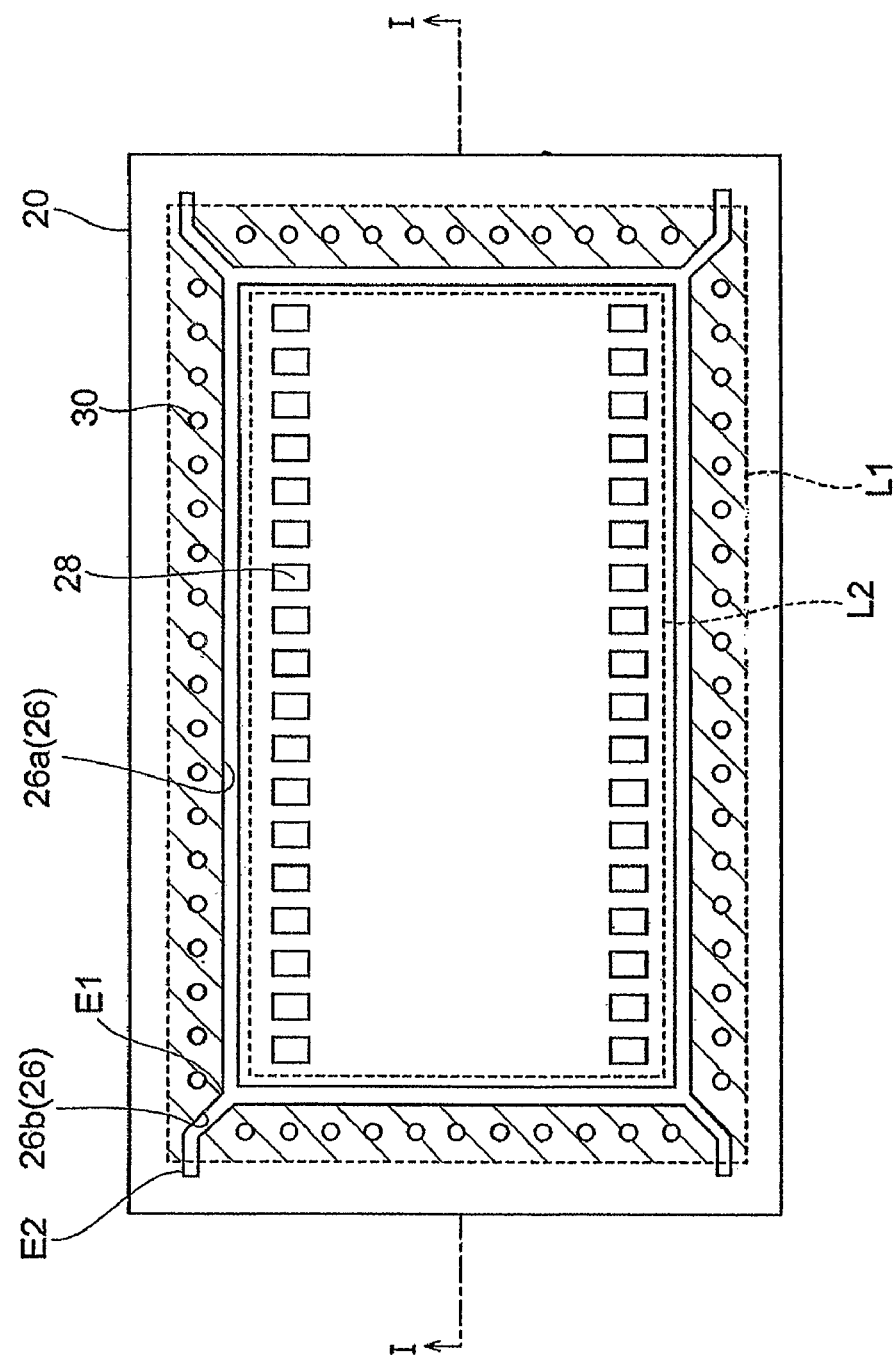
FIG. 2 is a plan view for describing an arrangement of a groove portion 26 of FIG. 1.

A groove portion 26 is formed in upper surface S4 of wiring substrate 20. An arrangement of groove portion 26 shall now be described using FIG. 2. FIG. 2 is a plan view of wiring substrate 20 as viewed from its upper surface S4 side. In FIG. 2, broken lines L1 and L2 indicate outlines of semiconductor substrate 10 and thinned portion 14, respectively. The sectional view taken on line I-I of this figure corresponds to being FIG. 1. As shown in FIG. 2, groove portion 26 includes a groove portion 26a (first groove portion) and groove portions 26b (second groove portions). Groove portions 26a and 26b are formed in upper surface S4 of wiring substrate 20 and extend along directions within the plane of the surface.

Groove portion 26a is formed along a periphery of a region (region surrounded by broken lines L2) of wiring substrate 20 that opposes thinned portion 14 of semiconductor substrate 10 and surrounds the region that opposes thinned portion 14. On wiring substrate 20, groove portion 26a has a rectangular shape as a whole. Meanwhile, a total of four groove portions 26b are formed, and one end E1 of each groove portion 26b is connected to one of the four corners of groove portion 26a. Another end E2 of each groove portion 26b is exposed at the outer side of a region (region surrounded by broken lines L1) of wiring substrate 20 that opposes semiconductor substrate 10. Each of groove portions 26b thus extends from groove portion 26a to an exposed surface of wiring substrate 20. Groove portions 26b thus function as communicating portions that put groove portion 26a and the exterior of semiconductor device 1 in communication.

An exposed surface of wiring substrate 20 refers to a surface, among the surfaces of wiring substrate 20, that is exposed to the exterior of semiconductor device 1. The region of the upper surface S4 of wiring substrate 20 that is positioned at the outer side of the region covered with resin 32, bottom surface S5 and side surfaces S6 of wiring substrate 20 (see FIG. 1) correspond to being exposed surfaces. Thus although the region of wiring substrate 20 that opposes thinned portion 14 is not covered with resin 32, since it is located at the inner side of the region covered by resin 32 as shown in FIG. 1, this region does not correspond to being an exposed surface.

In FIG. 2, the portions of the gap between semiconductor substrate 10 and wiring substrate 20 that are filled with resin 32 are indicated by slanted lines. As shown in this figure, in this embodiment, resin 32 fills only the portions of the above-mentioned gap at the outer side of groove portion 26a and does not fill portion 26a and portions at the inner side thereof. Portions at the outer side of groove portion 26a at which groove portions 26b are formed are also not filled with resin 32.

Furthermore, a plurality of chip resistors 28 are disposed on upper surface S4 of wiring substrate 20. Chip resistors 28 are aligned one-dimensionally in the left/right direction of the figure, respectively at an upper portion and a lower portion in the figure of the region of wiring substrate 20 that is surrounded by groove portion 26a.

Returning now to FIG. 1, operations of semiconductor device 1 shall be described. Light made incident on thinned portion 14 of semiconductor substrate 10 from light-incident surface S3 is detected by CCD 12. The detected signals pass through electrodes 16, conductive bumps 30, electrodes 22, in that order, and are thereby transmitted to wiring substrate 20. The detected signals (CCD read signals) are then transmitted to lead terminals 24 and output from lead terminals 24 to the exterior of semiconductor device 1.

The effects of semiconductor device 1 shall now be described. Resin 32 fills the gap between outer edge 15 of thinned portion 14 and wiring substrate 20. The strength of bonding of electrodes 16, disposed on outer edge 15 of thinned portion 14, with conductive bumps 30 and the strength of bonding of conductive bumps 30 with electrodes 22 of wiring substrate 20 are thereby reinforced. Meanwhile, because the gap between thinned portion 14 of semiconductor substrate 10 and wiring substrate 20 is not filled with resin 32, even if stress due to the thermal expansion coefficient difference between resin 32 and semiconductor substrate 10 arises between the two during heating or cooling in the process of curing resin 32, etc., the influence of the stress on thinned portion 14 will be low and distortion and cracking of thinned portion 14 are prevented. Thus with semiconductor device 1, high precision focusing with respect to CCD 12 is enabled and uniformity and stability of the high sensitivity of CCD 12 can be exhibited during use. Also, because cracking of thinned portion 14 is prevented, the manufacturing yield of semiconductor device 1 is improved.

Furthermore, wiring substrate 20 has groove portion 26a formed therein so as to surround the region opposing thinned portion 14. Thus, for example, in the process of filling the gap between semiconductor substrate 10 and wiring substrate 20 with the resin using the capillary phenomenon during manufacture of semiconductor device 1, when the resin entering into the gap from the periphery of semiconductor substrate 10 reaches groove portion 26a, the capillary phenomenon does not proceed any further and the entry of the resin stops. By such a groove portion 26a being provided in wiring substrate 20, the arrangement, wherein resin 32 fills the gap at which conductive bumps 30 exist, that is, the gap between wiring substrate 20 and outer edge 15 of thinned portion 14 while the gap between wiring substrate 20 and thinned portion 14 at the inner side of groove portion 26a is left unfilled, can be readily realized.

With semiconductor device 1, the gap between thinned portion 14 and wiring substrate 20 may become completely surrounded by resin 32 that fills the gap between outer edge 15 of thinned portion 14 and wiring substrate 20. In this case, if the surrounded gap becomes sealed, thinned portion 14 may become distorted due to expansion or contraction of the air inside the sealed space during heating or cooling in the process of curing the resin, etc. In regard to this issue, with semiconductor device 1, groove portions 26b that extend from groove portion 26a to the exposed surface of wiring substrate 20 are provided so that air can move freely between the gap surrounded by resin 32 and the exterior of semiconductor device 1 via groove portions 26b, and the gap surrounded by resin 32 is thereby prevented from becoming sealed.

A gas (air) is interposed between thinned portion 14 of the semiconductor substrate and wiring substrate 20. As this gas, an inert gas, such as nitrogen or argon is preferable, and distortions of both substrates can thereby be tolerated and degradation of the inner surfaces of the substrates can be restrained.

As with groove portion 26a, groove portions 26b are formed in the surface of wiring substrate 20 that opposes semiconductor substrate 10. In this case, since both groove portions 26a and 26b can be formed in the same process, the manufacture of wiring substrate 20 and thus of semiconductor device 1 as a whole is facilitated.

Semiconductor substrate 10 is provided with accumulation layer 18. The accumulation state of semiconductor substrate 10 is thereby maintained. Thereby the uniformity and stability of the sensitivity of CCD 12 with respect to short wavelength light can be improved further.

Figure 8:
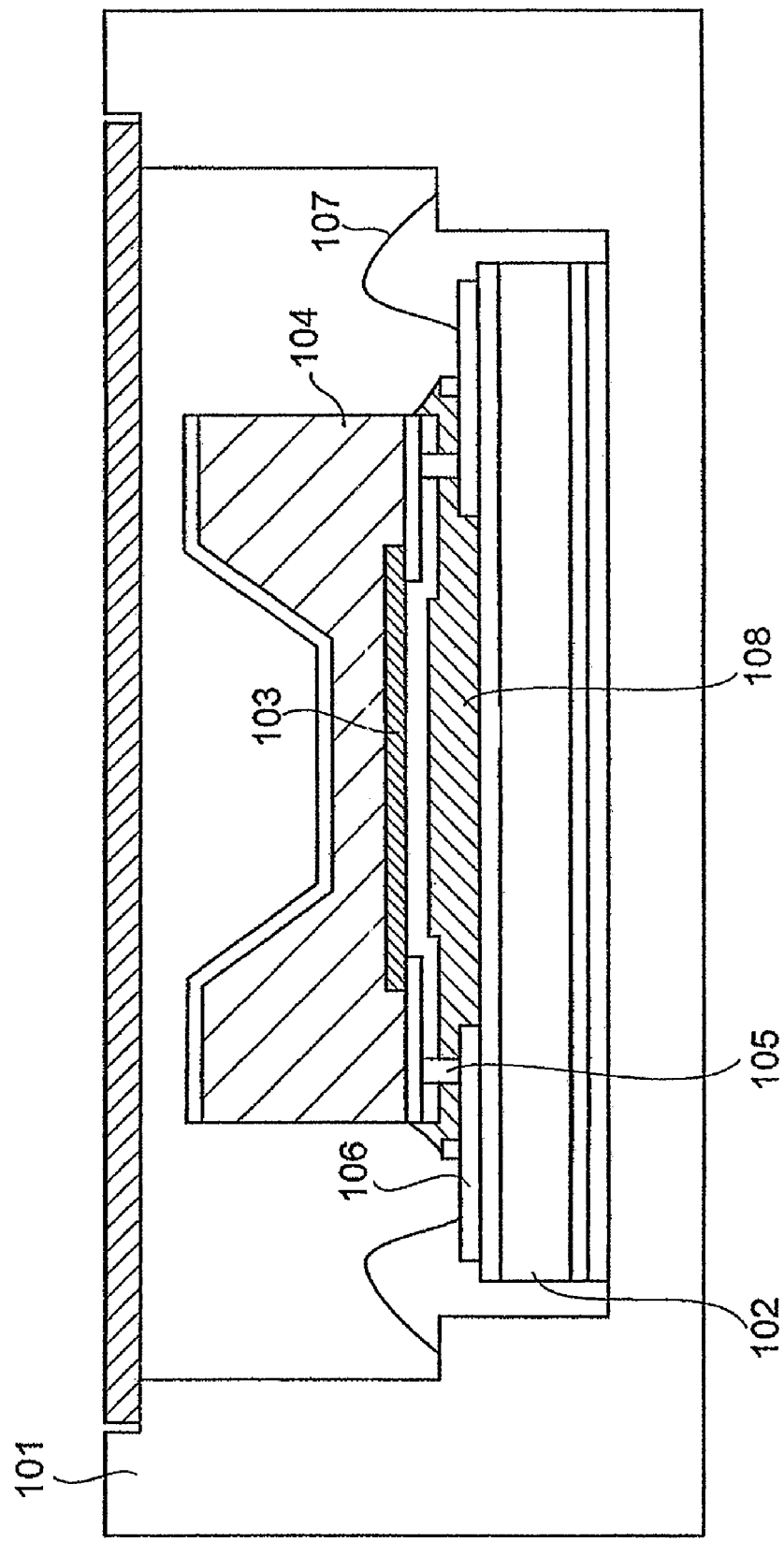
FIG. 8 is a sectional view of an arrangement of a conventional semiconductor device.

In recent years, demands for large area and high-speed response characteristics have been increasing for back-illuminated semiconductor devices. However, with an arrangement, such as that of the semiconductor device shown in FIG. 8, wherein the semiconductor substrate is die bonded once to the wiring substrate and then the wiring substrate is wire bonded to the lead terminals of the package, it is difficult to realize a large area and a high-speed response at the same time. That is, when the semiconductor device of this arrangement is made large in area, the resistance increases due to the accompanying elongation of the wires. Moreover, because in accordance with the making of the area large, the occurrence of crosstalk, the forming of capacitance (capacitor) between the wires, and other issues arise due to wires becoming close to each other and high in density, the realization of high-speed response is made even more difficult.

Meanwhile, with semiconductor device 1, because semiconductor substrate 10 is mounted onto wiring substrate 20 via conductive bumps 30, there is no need to perform wire bonding of semiconductor substrate 10 with wiring substrate 20. Furthermore, because wiring substrate 20 is provided with lead terminals 24, there is no need to provide a package besides wiring substrate 20 and thus, with semiconductor device 1, there is no need to perform wire bonding of wiring substrate 20 with lead terminals of a package. Thus with semiconductor device 1, because all of the wirings can be arranged without using wire bonding, even if a large area is to be realized, the above-mentioned problems of increased resistance, occurrence of crosstalk, and forming of capacitance do not occur. Semiconductor device 1 can thus meet the demands of both large area and high-speed response. For example, when the number of pixels of CCD 12 is 2054 pixels×1024 pixels (with the chip size (area of semiconductor substrate 10) being slightly over 40.0 mm×20 mm), whereas speeding up of the response to a rate of 1.6 Gpixels/sec or more is difficult with the conventional semiconductor device, high-speed operation at 3.2 Gpixels/sec is enabled with semiconductor device 1.

Figure 3:
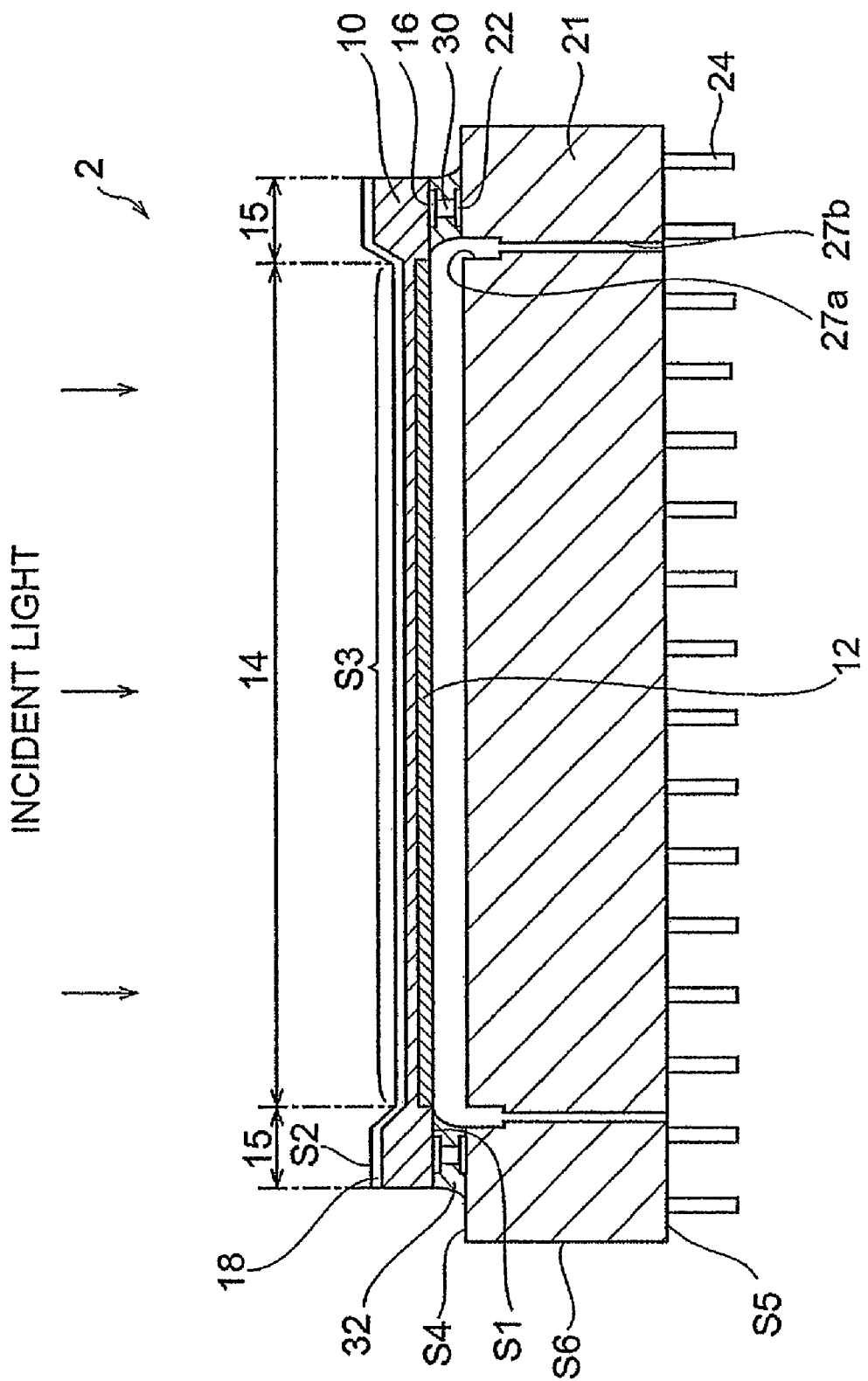
FIG. 3 is a sectional view of another embodiment of this invention's semiconductor device.

FIG. 3 is a sectional view of another embodiment of this invention's semiconductor device. A semiconductor device 2 has semiconductor substrate 10, a wiring substrate 21, conductive bumps 30, and resin 32. With semiconductor device 2, the structure of wiring substrate 21 differs from that of wiring substrate 20 of semiconductor device 1 shown in FIG. 1. Because the rest of arrangements are the same as those of semiconductor device 1 of FIG. 1, description thereof shall be omitted. Wiring substrate 21 has a groove portion 27a and through-holes 27b formed therein. As with groove portion 26a of semiconductor device 1, groove portion 27a is formed along the periphery of the region of the wiring substrate 21 that opposes thinned portion 14. With each through-hole 27b, one end is connected to groove portion 27a and the other end is exposed at bottom surface S5 of wiring substrate 21. That is, through-holes 27b pass through wiring substrate 21 and extend from groove portion 27a to bottom surface S5. Through-holes 27b thus function as communicating portions that put groove portion 27a and the exterior of semiconductor device 2 in communication.

Figure 4:
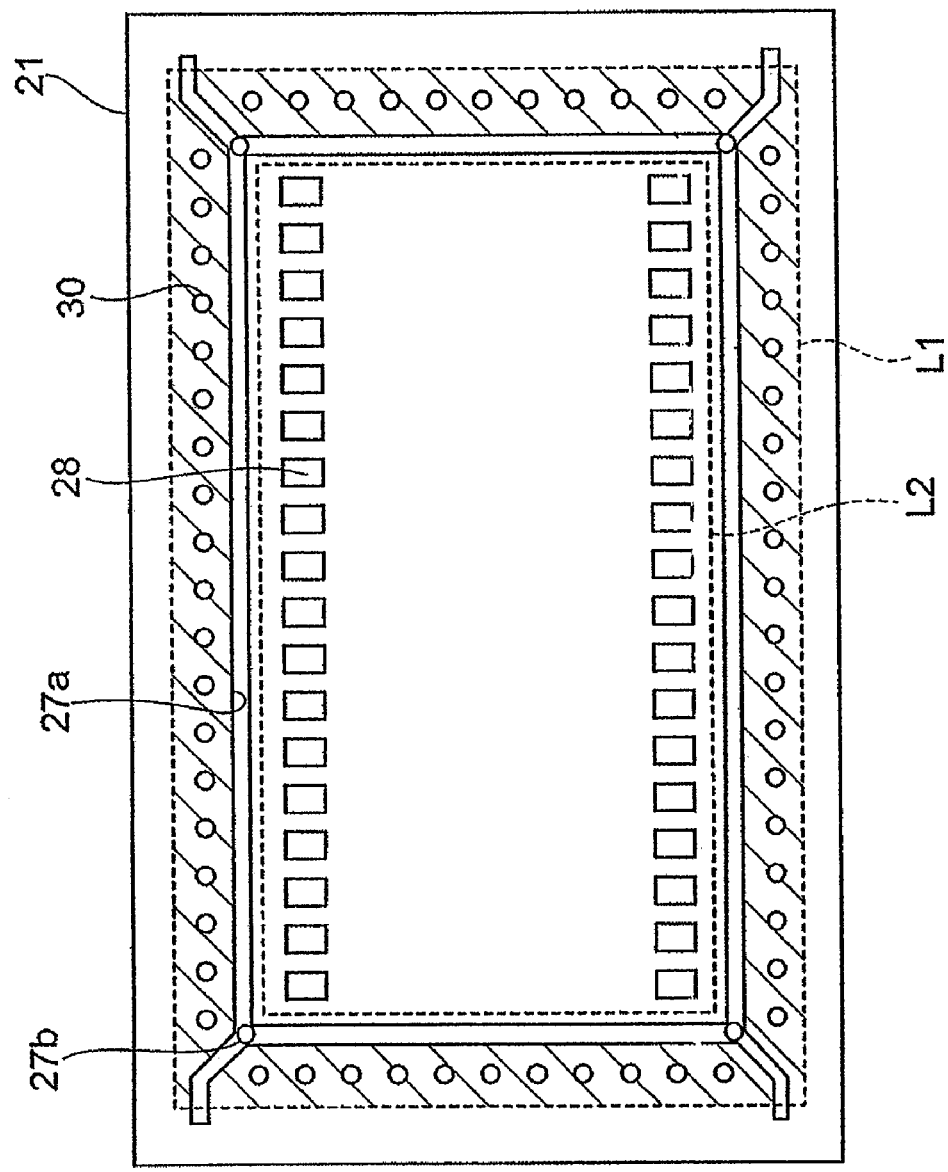
FIG. 4 is a plan view for describing structures of a groove portion 27a and a through-holes 27b of FIG. 3.

The structures of groove portion 27a and through-holes 27b shall now be described in more detail using FIG. 4. FIG. 4 is a plan view of wiring substrate 21 as viewed from its upper surface S4 side. As shown in this figure, through-holes 27b have cylindrical shapes and are respectively formed at and connected to the four corners of groove portion 27a. With this embodiment, in accordance with communicating portions (through-holes 27b) not being formed on upper surface S4 of wiring substrate 21, the entirety of the portion of the gap between semiconductor substrate 10 and wiring substrate 21 that lies to the outer side of groove portion 27a (the portion provided with slanted lines in FIG. 4) is filled with resin 32.

With semiconductor device 2 of the above arrangement, distortion and cracking of thinned portion 14 are prevented as with semiconductor device 1, and thus high precision focusing with respect to CCD 12 is enabled and uniformity and stability of the high sensitivity of CCD 12 can be exhibited during use. Furthermore, by groove portion 27a being formed in wiring substrate 21, the arrangement, wherein resin 32 fills the gap between wiring substrate 21 and outer edge 15 of thinned portion 14 while the gap between wiring substrate 21 and thinned portion 14 is left unfilled, can be readily realized. Groove portions, which are the same communicating portions as groove portions 26b described above, extend from the four corners of the rectangular groove portion 27a to the four corners of wiring substrate 21, and through-holes 27b are formed at the positions at which the groove portions are connected. By through-holes 27b being formed in wiring substrate 21, the gap between thinned portion 14 and wiring substrate 21 can be prevented from being sealed, and the distortion of thinned portion 14 due to expansion or contraction of air in a sealed space can thus be prevented.

Through-holes 27b are provided as communicating portions that put the gap between thinned portion 14 and wiring substrate 21 in communication with the exterior of semiconductor device 2. Since the sealing of the gap between thinned portion 14 and wiring substrate 21 can thus be prevented by through-holes 27b even when the entirety of the gap between outer edge 15 of thinned portion 14 and wiring substrate 21 is filled with resin 32, the mechanical strength of semiconductor device 2 can be further improved.

Figure 5:
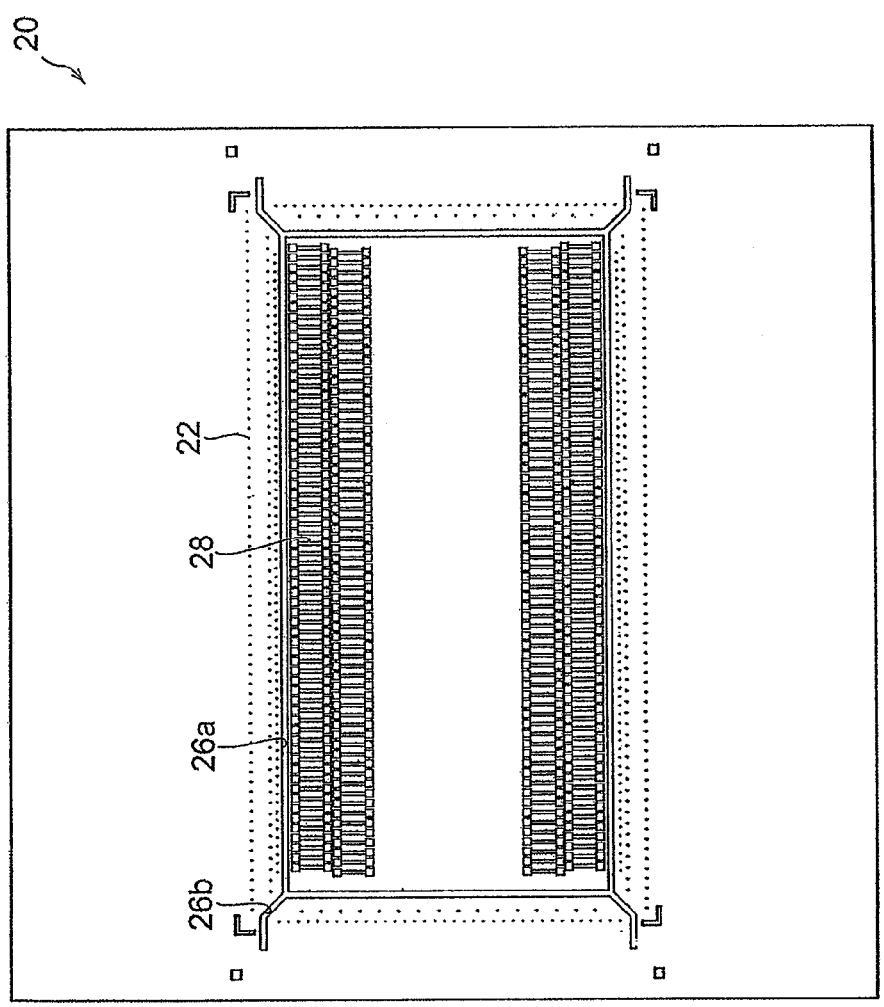
FIG. 5 is a plan view of an arrangement example of wiring substrate 20 of FIG. 1.

FIG. 5 is a plan view of an arrangement example of wiring substrate 20 of FIG. 1. Wiring substrate 20 of this arrangement example is a multilayer ceramic substrate. This wiring substrate 20 has a substantially square shape of 58.420 mm square in plan view and has groove portion 26a, which defines a rectangle of 38.700 mm×18.900 mm, formed in a central portion thereof. Also, groove portions 26b are formed so as to be respectively connected to the four corners of groove portion 26a. The plurality of chip resistors 28 are disposed in the rectangular region surrounded by groove portion 26a. In this region, chip resistors 28 are aligned one-dimensionally in the left/right direction of the figure (in the direction of the long sides of the above-mentioned rectangle) in two columns at each of an upper portion and a lower portion in the figure. The plurality of electrodes 22 are formed in a region at the outer side of groove portion 26a. Electrodes 22 are aligned along each of the four sides of the above-mentioned rectangle, forming three columns along each of the long sides and forming two columns along each of the short sides. The diameter of each electrode 22 is 0.080 mm.

Figure 6:
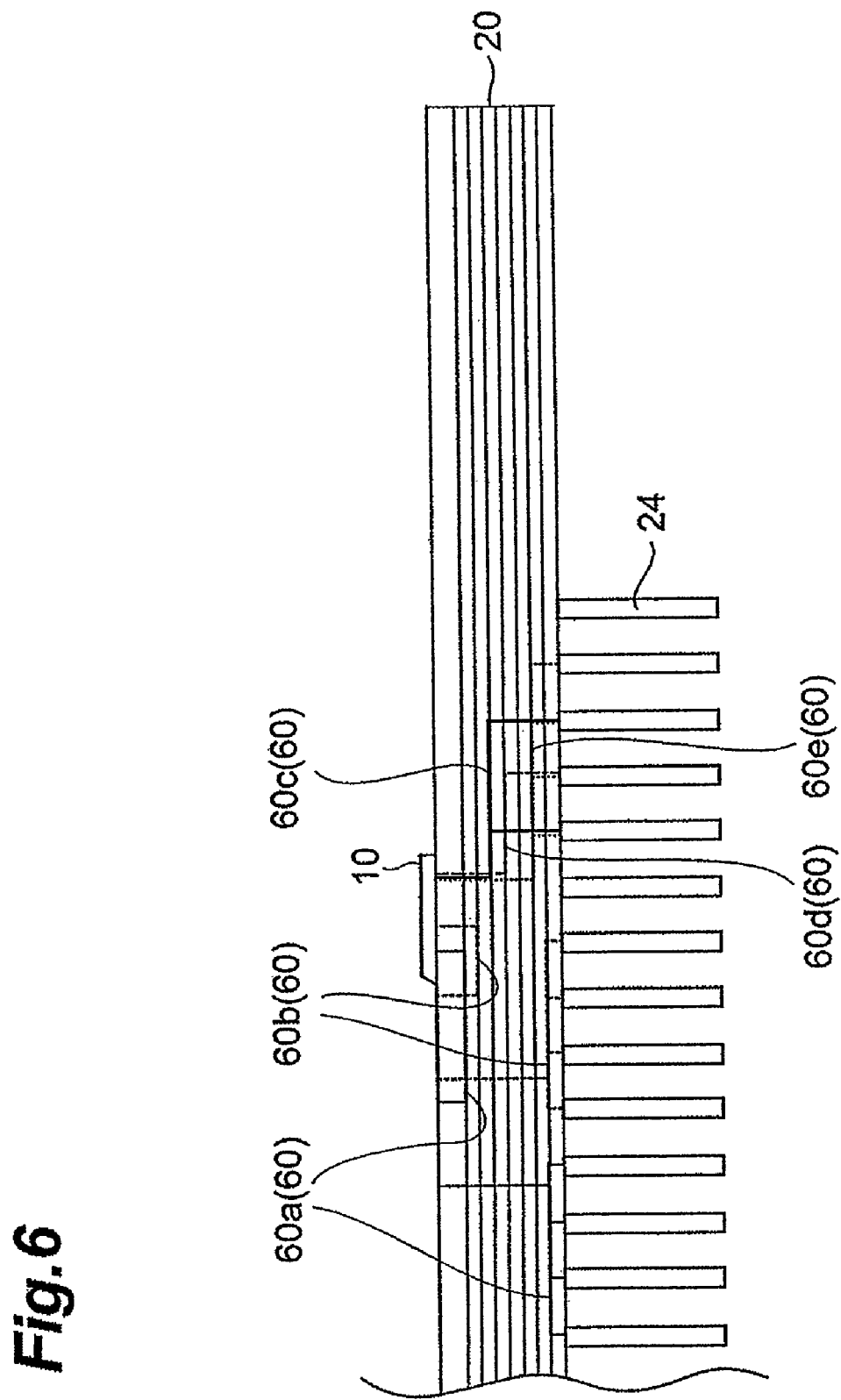
FIG. 6 is a sectional view of an arrangement of internal wirings of wiring substrate 20 of the arrangement example of FIG. 5.

FIG. 6 is a sectional view of an arrangement of internal wirings of wiring substrate 20 of the arrangement example of FIG. 5.

Figure 7:
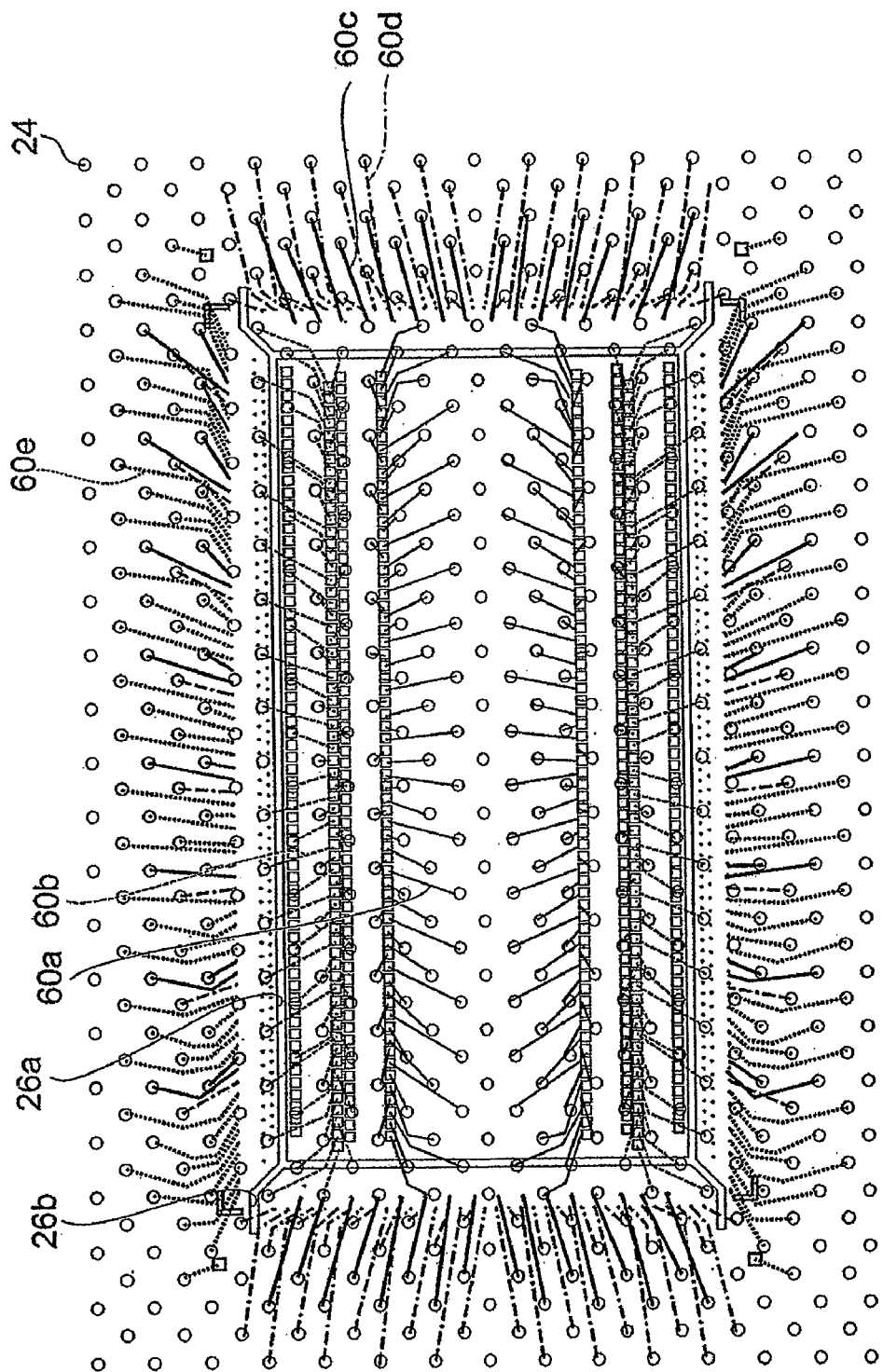
FIG. 7 is a sectional view for describing the arrangement of internal wirings 60 of FIG. 6.

Internal wirings 60 include signal output wirings 60a and 60b, clock supplying wirings 60c and 60d, and DC bias (ground) supplying wirings 60e. Each internal wiring 60 electrically connects an electrode 22, a lead terminal 24, and a chip resistor 28 to each other. The arrangement of internal wirings 60 shall now be described in more detail using FIG. 7. In FIG. 7, a plurality of lead terminals 24 are indicated overlappingly on a plan view of wiring substrate 20 for the sake of description. As shown in this figure, whereas only signal output wirings 60a and 60b are formed at portions to the inner side of groove portion 26a, clock supplying wirings 60c and 60d and DC bias (clock) supplying wiring 60e are formed at portions to the outer side of groove portion 26a. By thus positioning the driving system wirings of clock supplying wirings 60c and 60d and DC bias supplying wiring 60e separately from signal output wirings 60a and 60b, the occurrence of crosstalk between the driving system signals and the output system signals can be prevented.

That is, on the wiring substrate are disposed first lead terminals 24, to which are provided signals for driving the photodetecting unit, and second lead terminals (24; indicated by the same symbol) for outputting detected signals from the photodetecting unit, and among the plurality of second electrodes 22, those that are connected to the second lead terminals (24) are positioned inside the region surrounded by groove portion 26a, and among the plurality of second electrodes 22, those that are connected to the first lead terminals (24) are positioned outside the region surrounded by groove portion 26a. In this case, since second electrodes 22 that provide the driving signals (clock) and second electrodes 22 for reading signals (outputting signals) are positioned in a physically separated manner across groove portion 26a as a boundary, crosstalk can be restrained.

This invention's semiconductor device is not restricted to the embodiment described above and various modifications are possible. For example, although an arrangement, wherein the other ends of the communicating portions (groove portions 26b) are exposed at the outer side of the region of wiring substrate 20 that opposes semiconductor substrate 10, was shown in FIG. 2 and an arrangement, wherein the other ends of the communicating portions (through-holes 27b) are exposed at bottom surface S5, was shown in FIG. 3, the other ends of the communicating portions may instead be exposed at side surfaces S6 of wiring substrate 20 or 21.

Also, although arrangements, in each of which groove portion 26a or 27a completely surrounds the region of wiring substrate 20 or 21 that opposes thinned portion 14, were described, an arrangement, wherein groove portion 26a or 27a surrounds the above-mentioned region except at portions of the periphery of the region, is also possible.

Also, although arrangements, in each of which four groove portions 26b and four through-holes 27b are respectively formed in wiring substrate 20 and 21, were described, an arrangement, wherein just one of the groove portions or one of the through-holes is formed, is possible as is an arrangement, wherein two or more of the groove portions or the through-holes are formed.

INDUSTRIAL APPLICABILITY

This invention concerns a semiconductor device and can be used especially in a back-illuminated semiconductor device.

The invention claimed is:

1. A back-illuminated semiconductor device comprising:
   a semiconductor substrate, having:
      a photodetecting unit formed on one surface,
      a recess formed by etching a region, opposing the photodetecting unit, of another surface, wherein the recess is formed at light incident side of the semiconductor substrate,
      an outer edge surrounding the recess,
      and first electrodes disposed on the one surface at the outer edge and electrically connected to the photodetecting unit;
   a wiring substrate, disposed to oppose the one surface side of the semiconductor substrate and having second electrodes connected via conductive bumps to the first electrodes; and
   a resin, filling a gap between the wiring substrate and the outer edge with the conductive bumps;
   wherein the wiring substrate has formed therein a groove portion that surrounds a region opposing the recess and communicating portions that extend from the groove portion to an exposed surface of the wiring substrate,
   wherein the exposed surface of the wiring substrate is located at an outer side of a region covered by the resin.

2. The semiconductor device according to claim 1, wherein the communicating portions are second groove portions formed on a surface of the wiring substrate that opposes the semiconductor substrate.

3. The semiconductor device according to claim 1, wherein the communicating portions are through-holes that pass through the wiring substrate.

4. The semiconductor device according to any of claims 1 through 3, wherein the photodetecting unit has a plurality of pixels that are arrayed one-dimensionally or two-dimensionally.

5. The semiconductor device according to claim 1, wherein the wiring substrate has first lead terminals, to which signals that drive the photodetecting unit are provided, and second lead terminals that output detected signals from the photodetecting unit,
   and among the plurality of second electrodes, those that are connected to the second lead terminals are positioned inside the region surrounded by the groove portion,
   among the plurality of second electrodes, those that are connected to the first lead terminals are positioned outside the region surrounded by the groove portion.

6. The semiconductor device according to claim 1, wherein a gas is interposed between the recess of the semiconductor substrate and the wiring substrate.

* * * * *